(12) United States Patent
Yu et al.

(10) Patent No.: US 7,414,839 B2
(45) Date of Patent: Aug. 19, 2008

(54) HEAT DISSIPATION DEVICE HAVING A FAN HOLDER FOR ATTACHMENT OF A FAN

(75) Inventors: Guang Yu, Shenzhen (CN); Da-Yuan Zhou, Shenzhen (CN); Shih-Hsun Wung, Taipei Hsien (TW); Chun-Chi Chen, Taipei Hsien (TW)

(73) Assignees: Fu Zhun Precision Industry (Shen Zhen) Co., Ltd., Shanzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 80 days.

(21) Appl. No.: 11/564,260

(22) Filed: Nov. 28, 2006

(65) Prior Publication Data
US 2008/0123293 A1 May 29, 2008

(51) Int. Cl.
*H05K 7/20* (2006.01)
*H01L 23/34* (2006.01)

(52) U.S. Cl. .................. 361/695; 361/692; 361/697; 361/704; 415/213.1; 415/214.1; 415/220; 165/80.3; 165/104.33; 165/121; 165/122; 165/185; 29/888.025; 29/889.3; 174/16.3

(58) Field of Classification Search .................. 361/687, 361/690–697, 704–712, 715, 719; 165/67, 165/76, 80.2, 80.3, 80.4, 80.5, 104.33, 104.34, 165/121–126, 185; 415/213.1, 214.1, 220; 174/15.1, 16.1, 16.3, 252; 257/706–727; 24/457, 458
See application file for complete search history.

(56) References Cited

U.S. PATENT DOCUMENTS

| | | | | |
|---|---|---|---|---|
| 5,677,829 | A * | 10/1997 | Clemens | 361/697 |
| 6,449,152 | B1 * | 9/2002 | Lin | 361/697 |
| 6,592,327 | B2 * | 7/2003 | Chen et al. | 415/213.1 |
| 6,896,046 | B2 * | 5/2005 | Lee et al. | 165/185 |
| 7,044,204 | B2 * | 5/2006 | Chen et al. | 165/122 |
| 7,086,456 | B2 * | 8/2006 | Lee et al. | 165/121 |
| 7,131,485 | B2 * | 11/2006 | Yu et al. | 165/80.3 |
| 7,147,435 | B2 * | 12/2006 | Lien et al. | 415/213.1 |
| 7,289,324 | B2 * | 10/2007 | Yu | 361/697 |
| 7,301,769 | B2 * | 11/2007 | Li et al. | 361/697 |

FOREIGN PATENT DOCUMENTS

DE 202004017271 U1 * 4/2005

* cited by examiner

*Primary Examiner*—Michael V Datskovskiy

(57) ABSTRACT

A heat dissipation device comprises a heat sink, a fan, and a fan holder. The heat sink includes a base and a plurality of fins arranged on the base. The fan includes a frame having an engaging flange at each corner thereof. The fan holder configured for attaching the fan to the heat sink includes a main body having two opposite sidewalls extending upwardly from two opposite sides of the main body, a peg extending through the sidewall and movable in a direction perpendicular to the sidewall, and a handle capable of operating the peg. At least one of the engaging flanges of the fan is depressed by the peg towards the main body, thereby securing the fan on the fan holder.

16 Claims, 6 Drawing Sheets

# HEAT DISSIPATION DEVICE HAVING A FAN HOLDER FOR ATTACHMENT OF A FAN

BACKGROUND OF THE INVENTION

1. Field of the Invention

The present invention relates generally to a heat dissipation device, and more particularly to a heat dissipation device incorporating a fan for dissipating heat generated by an electronic device. The heat dissipation device has a fan holder for attachment of the fan.

2. Description of Related Art

It is well known that during operation computer electronic devices such as central processing units (CPU) can generate large amounts of heat. The heat must be quickly removed from the electronic device to prevent it from becoming unstable or being damaged. Typically, a heat sink is attached to an outer surface of the electronic device to absorb heat from the electronic device, and the heat absorbed by the heat sink is then dissipated to ambient air.

Generally, in order to improve heat dissipation efficiency of a heat sink, a fan is used to provide forced airflow to the heat sink. Usually, the fan is mounted to the heat sink directly or via a fan holder. Conventionally, the heat sink mainly comprises a heat-conducting base for contacting the heat generating electronic device and a plurality of heat dissipating fins extending from one face of the base. Typically, the fan is secured either on the heat sink or the fan holder by a plurality of screws. The fan defines a plurality of fixing holes corresponding to the screw threads of the heat sink or the fan holder. The pluralities of screws are engagingly received in the fixing holes of the fan and the screw threads of the heat sink or the fan holder, thereby attaching the fan to the heat sink. In this way, the fan can be mounted on the heat sink via a number of screws. However, complexities arise when installing the fan to the heat sink by using multiple screws which require a screwdriver to fix in place, as it may slip and damage nearby electronic components.

What is needed, therefore, is a heat dissipation device incorporating a fan holder to easily mount a fan on a heat sink.

SUMMARY OF THE INVENTION

A heat dissipation device comprises a heat sink, a fan, and a fan holder. The heat sink includes a base and a plurality of fins arranged on the base. The fan includes a frame having an engaging flange at each corner thereof. The fan holder adapted for attaching the fan to the heat sink includes a main body having two opposite sidewalls, a peg extending through the sidewall and movable in a direction perpendicular to the sidewall, and a handle capable of operating the peg. At least one of the engaging flanges of the fan is sandwiched between the peg and the main body so that the fan is secured to the fan holder. By pulling the handle outwardly to move the peg outwardly, the fastening of the fan 30 to the fan holder 20 is released.

Other advantages and novel features will become more apparent from the following detailed description of preferred embodiments when taken in conjunction with the accompanying drawings, in which:

BRIEF DESCRIPTION OF THE DRAWINGS

Many aspects of the present apparatus and method can be better understood with reference to the following drawings. The components in the drawings are not necessarily drawn to scale, the emphasis instead being placed upon clearly illustrating the principles of the present apparatus and method. Moreover, in the drawings, like reference numerals designate corresponding parts throughout the several views.

DETAILED DESCRIPTION OF THE INVENTION

Figure 1:
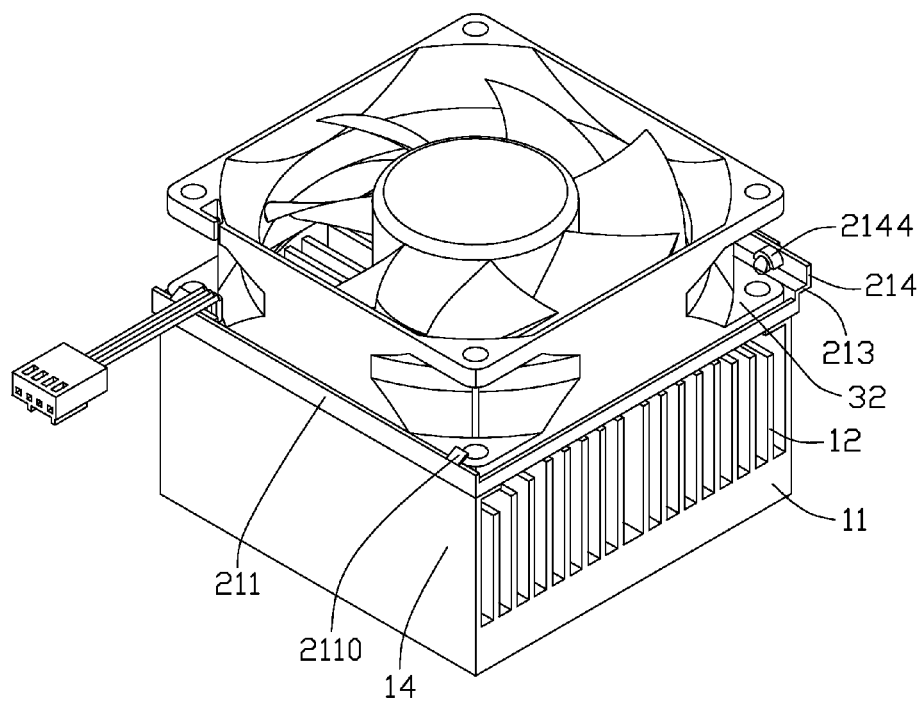
FIG. 1 is an assembled view of a heat dissipation device in accordance with a preferred embodiment of the present invention.

FIGS. 1, 2, 4 and 5 illustrate a heat dissipation device in accordance with a preferred embodiment of the present invention. The heat dissipation device comprises a heat sink 10, a fan holder 20 located on a top of the heat sink 10, and a fan 30 mounted on the fan holder 20.

The heat sink 10 is integrally extruded from a heat conductive material, such as aluminium, and comprises a base 11 and a plurality of fins 12, 14 perpendicularly extending from the base 11. The base 11 has a bottom face for contacting a heat-generating electronic component such as a CPU (not shown). Heights of the fins 12 gradually decrease with distance from a middle to two lateral sides of the heat sink 10. The fins 12 are located between the fins 14. Each fin 14 is slightly higher than the highest one of the fins 12, and is bent inwardly and horizontally from a top edge thereof to form a support 140. Each support 140 defines two fixing holes 142 adjacent to two opposite ends thereof for engaging with screws (not shown) to mount the fan holder 20 thereon.

Figure 2:
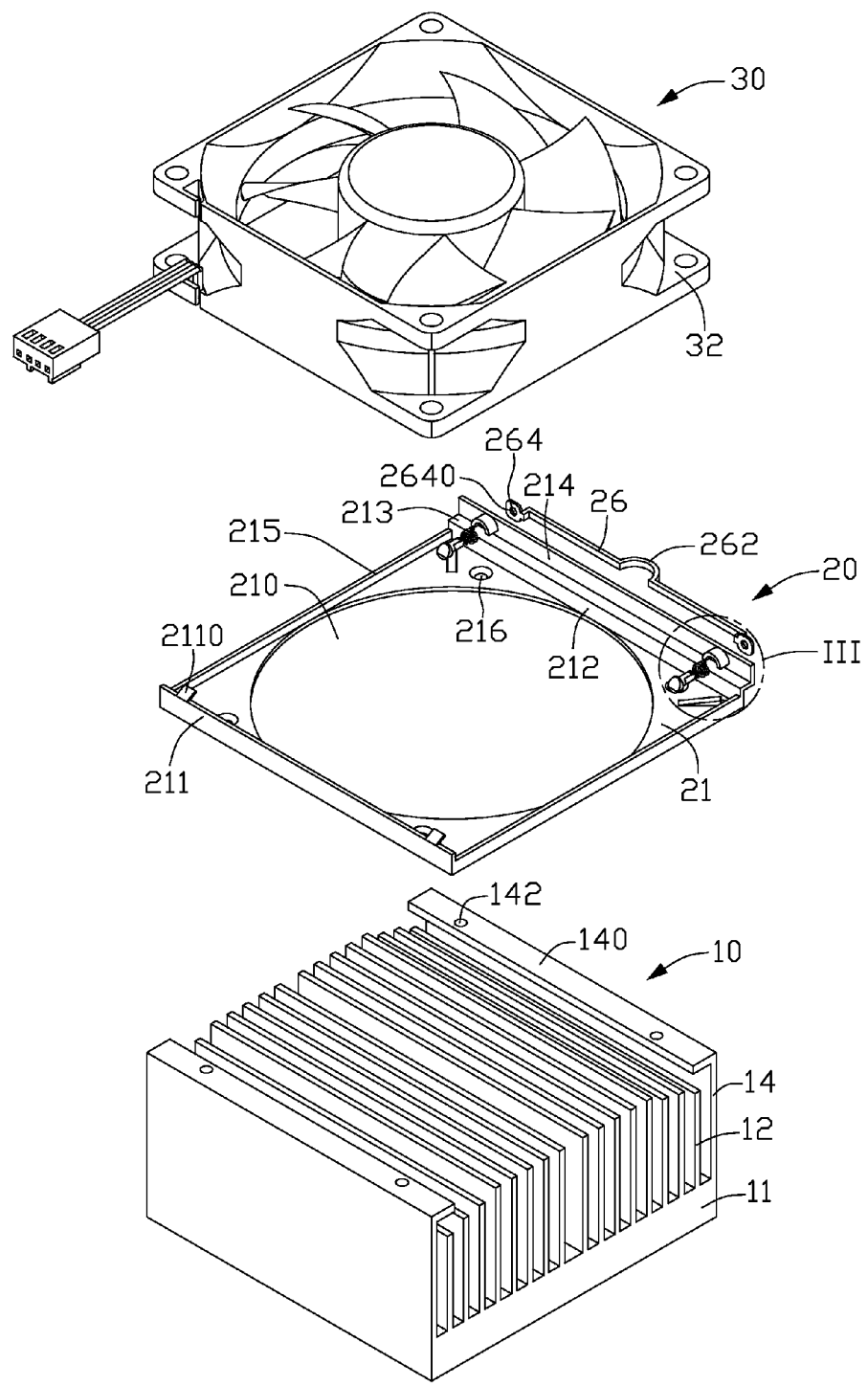
FIG. 2 is an exploded, isometric view of FIG. 1.
Figure 3:
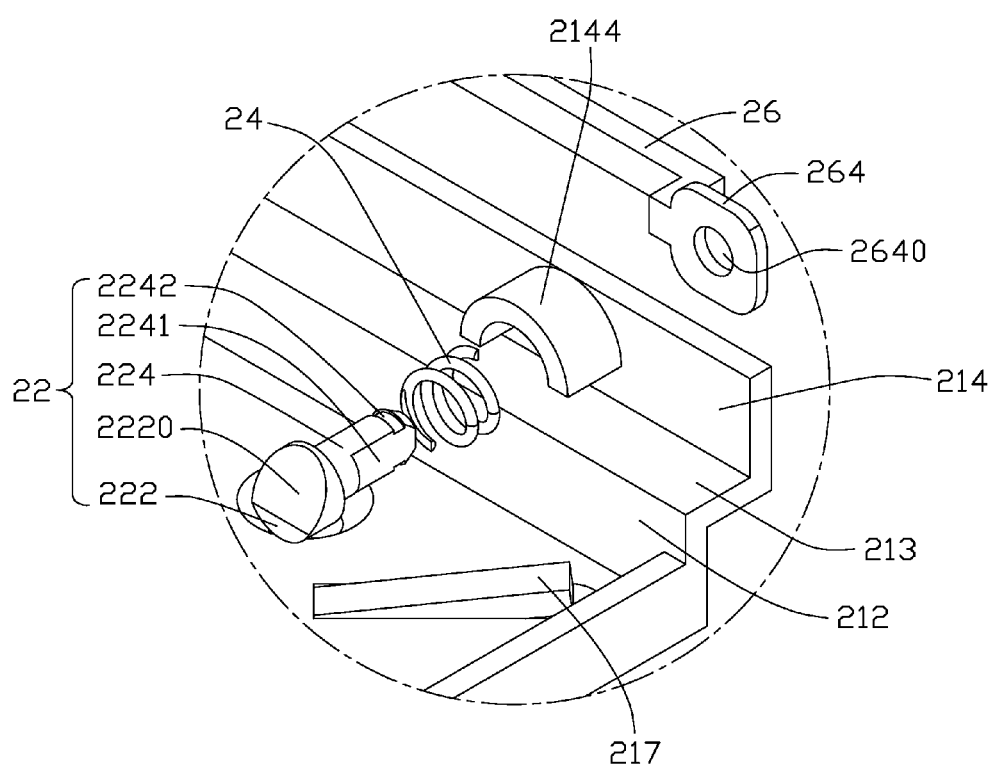
FIG. 3 is an enlarged view of a part of a fan holder shown in circled portion III of FIG. 2.
Figure 4:
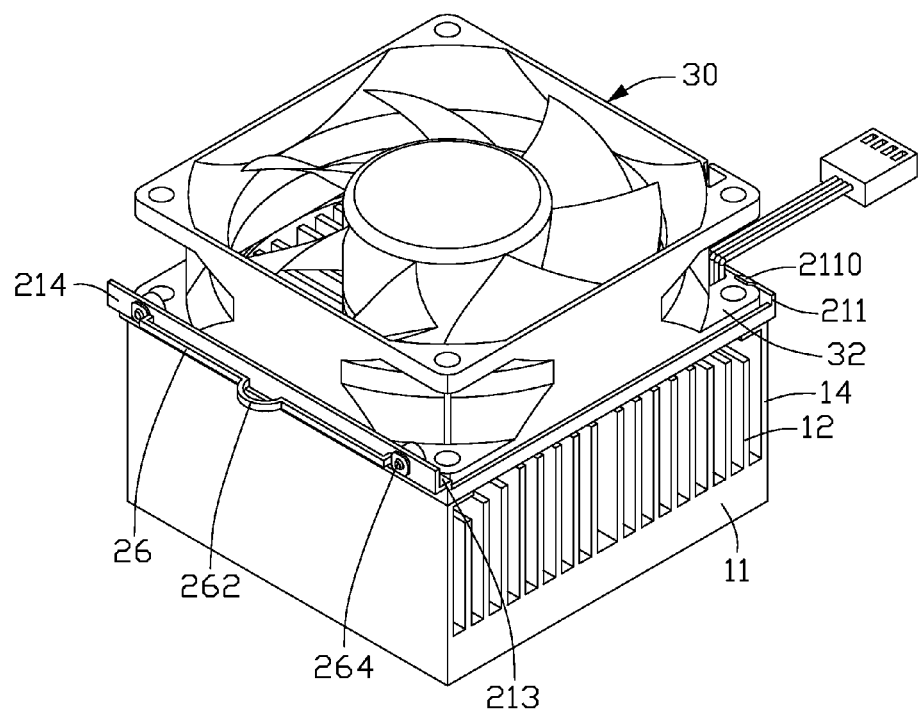
FIG. 4 is similar to FIG. 1, but viewed from a different aspect.
Figure 5:
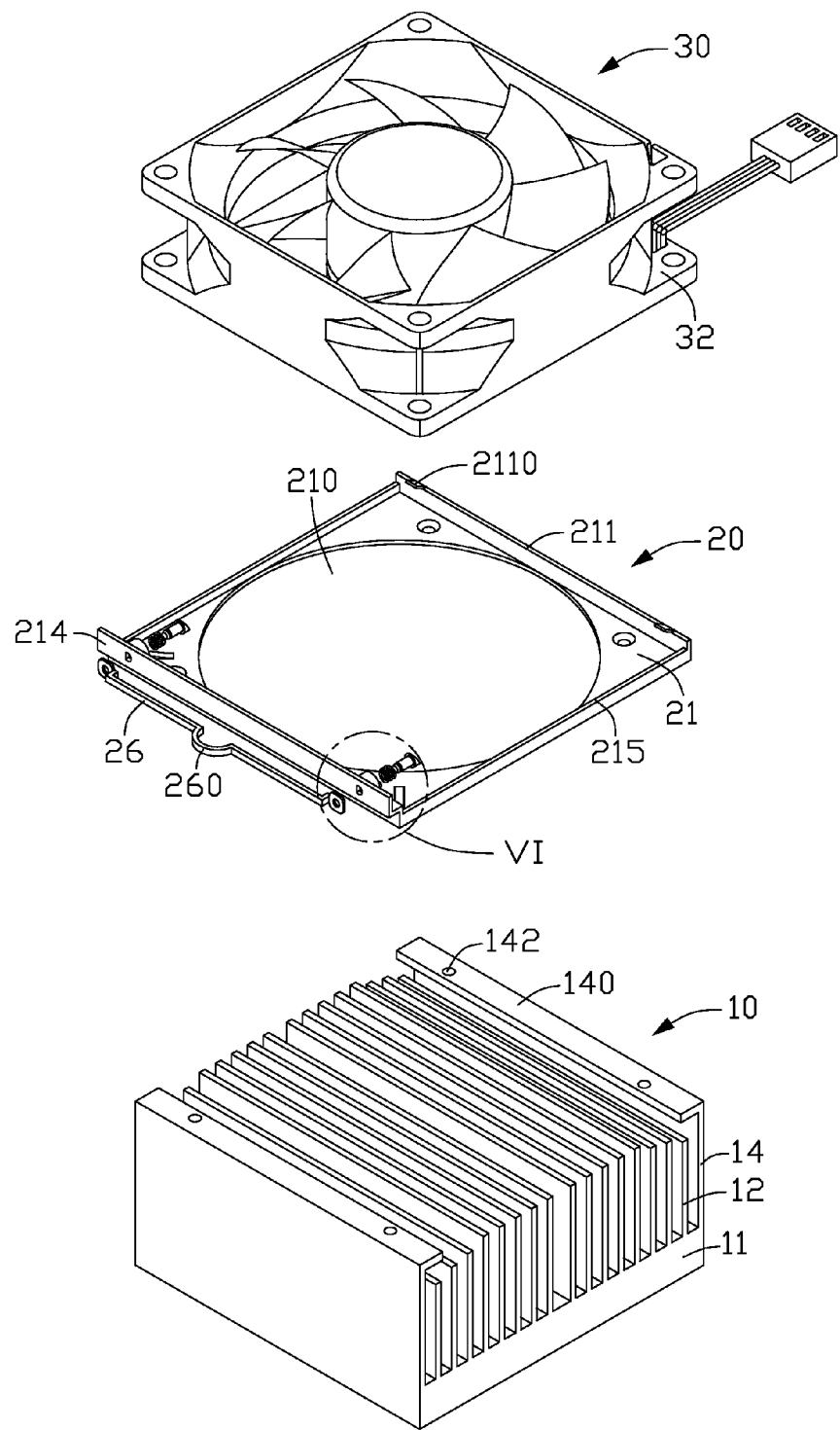
FIG. 5 is an exploded, isometric view of FIG. 4.

As shown in FIGS. 2 and 3, the fan holder 20 comprises a main body 21, two pegs 22, two springs 24 respectively surrounding the pegs 22 and a handle 26. The main body 21 is substantially rectangular and made of a resilient metal such as stainless or plated steel. A circular window 210 is defined at a centre of the main body 21 for allowing airflow generated from the fan 30 to pass through. A first sidewall 211 extends upwardly and perpendicularly from one edge of the main body 21. A locking structure is arranged on the first sidewall 211 for locking one side of the fan 30. In the preferred embodiment, the locking structure is embodied as two locking plates 2110 extending inwardly and upwardly from a top edge of the first sidewall 211 and located adjacent to two opposite ends of the first sidewall 211. A second sidewall 212 with a height similar to that of the first sidewall 211, extends upwardly and perpendicularly from another edge of the main body 21 opposing the first sidewall 211 and is also provided with a locking structure. In the preferred embodiment, the locking structure comprises the two discrete pegs 22 for locking another side of the fan 30.

Figure 6:
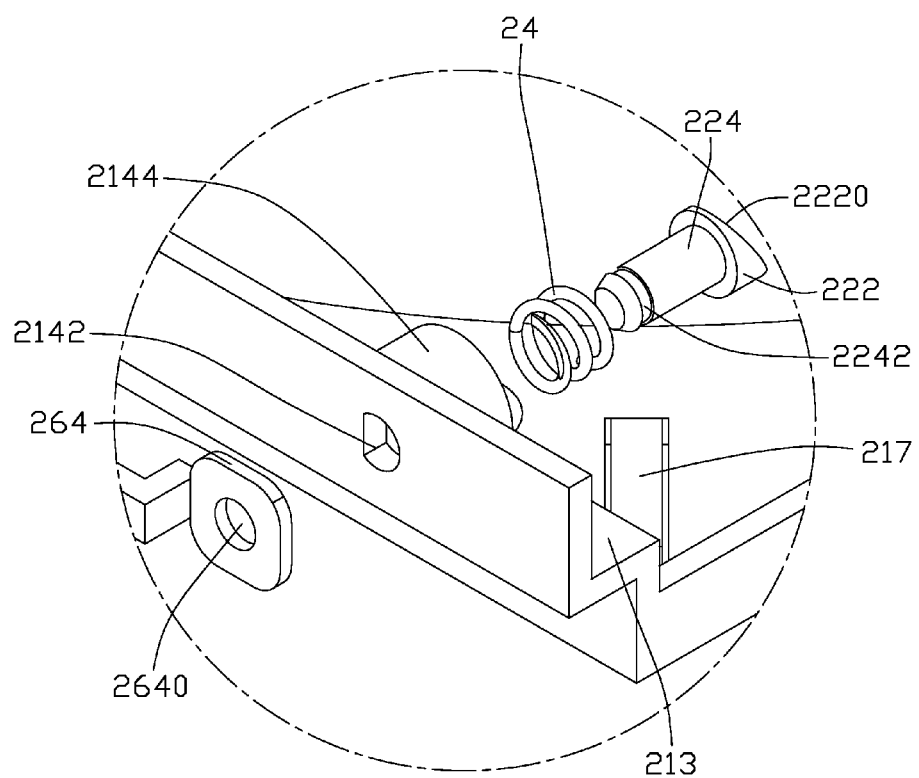
FIG. 6 is an enlarged view of a part the fan holder shown in circled portion VI of FIG. 5.

Particularly referring to FIGS. 3 and 6, a connecting plate 213 extends outwardly and horizontally from a top edge of the second sidewall 212. A mounting plate 214 extends perpendicularly and upwardly from a distal end of the connecting plate 213. The mounting plate 214 defines two through holes 2142 adjacent to two opposite ends thereof for receiving the pegs 22. Each through hole 2142 may have any asymmetrical configuration, and is arciform in this embodiment. The mounting plate 214 has two arched flanges 2144 projecting inwardly from an inner side thereof. Each arched flange 2144 is above the connecting plate 213 and incorporates the connecting plate 213 to define a channel (not labeled) in communication with the corresponding through holes 2142, for accommodating a corresponding peg 22.

The main body 21 has a pair of parallel inhibiting flanges 215 extending upwardly and perpendicularly from two horizontal edges thereof. The inhibiting flanges 215 and the sidewalls 211, 212 co-operatively form an enclosure for accommodating the fan 30. The main body 21 defines a bore 216 adjacent to each corner thereof corresponding to the fixing hole 142 of the heat sink 10. Two slim tabs 217 tilt upwards from two adjacent corners of the main body 21 approximating to the second sidewall 212 and respectively orient the two adjacent corners of the main body 21. The tabs 217 upwardly support the fan 30 thereon and incorporate the locking structure of the second sidewall 212 to sandwich the fan 30 therebetween.

The handle 26 comprises a semicircular operating portion 262 and two locking portions 264. The operating portion 262 is positioned at a middle of the handle 26. The locking portions 264 extend from two opposite ends of the handle 26 and are offset (i.e., extended) toward the mounting plate 214. Each locking portion 264 defines a locking hole 2640 therein for engagingly receiving an end of a corresponding peg 22.

Each peg 22 is formed from a molded elastic plastic and comprises a head 222 and a shaft 224. A portion of top surface of the head 222 is cut away to define a slope 2220 upwardly oriented for facilitating the fan 30 to slip thereover. The shaft 224 axially extends from a bottom of the head 222 and has a diameter smaller than that of the head 222. The shaft 224 defines an annular recess 2242 therein adjoining to a distal end thereof, for fittingly engaging with the locking hole 2640 of the handle 26. The distal end of the shaft 224 forms a prong with an annular inclined surface at periphery thereof for facilitating the shaft 224 to pass through the locking hole 2640 of the handle 26. The shaft 224 is dimensioned corresponding to the through hole 2142 and has a flat side face 2241 for fitting with a flat side (not labeled) of the through hole 2142, so as to avoid rotation of the peg 22 in the through hole 2142.

In the fan holder 20, the pegs 22 encircled by the springs 24 are extended through the channels, the through holes 2142 and nested in the handle 26 with the locking portions 264 defining the locking holes 2640 securely engaging in the annular recesses 2242 of the pegs 22. The pegs 22 are movable in the channels and the through holes 2142. The springs 24 are held between the heads 222 and the mounting plate 214. The handle 26 is located outside the enclosure of the fan holder 20. Generally, the pegs 22 are horizontally stretched beyond the connecting plate 213 and extended into the enclosure. However, when the handle 26 is pulled outwardly, the pegs 22 can move through the connecting plate 213 toward the mounting plate 214 and away from the enclosure.

The fan 30 has a rectangular frame (not labeled) fittingly accommodated in the enclosure formed by the sidewalls 211, 212 and the inhibiting flanges 215. The frame defines an engaging flange 32 at each corner thereof, which has a height identical to that of the sidewalls 211, 212.

Referring to FIGS. 1-6, the fan 30 is attached to the heat sink 10 by placing the fan holder 20 on the supports 140 of the heat sink 10 and securing it in place using screws (not shown) extending through the corresponding bores 216 of the fan holder 20 and the fixing holes 142 of the support 140. Subsequently, the fan 30 is placed slantwise on the fan holder 20. One side of the fan 30 slides toward the first sidewall 211 until the neighboring engaging flanges 32 at the side of the fan 30 are disposed between the main body 21 and the locking plates 2110. Another side of the fan 30 is then pushed downwardly. The slopes 2220 of the pegs 22 are forced outwards by the fan 30 and move outwardly towards the mounting plate 214. The heads 222 of the pegs 22 compress the springs 24 encircling the pegs 22. After the another side of the fan 30 wholly slides over the slopes 2220, the pegs 22 are released and leave the mounting plate 214 due to expansion of the springs 24 to urge another two neighboring engaging flanges 32 toward the main body 21 of the fan holder 20. At this time, the tabs 217 resiliently resist the another two neighboring engaging flanges 32. Thus, the another side of the fan 30 is fittingly sandwiched between the tabs 217 and the pegs 22. The fan 30 is therefore firmly secured on the fan holder 20.

The fan 30 is detached from the fan holder 20 by pulling the operating portion 262 of the handle 26 outwardly thus causing pegs 22 to move toward the mounting plate 214, until the another side of the fan 30 moves out of the enclosure. Then, the fan 30 can easily be removed from the enclosure.

Alternatively, the locking structure on the second sidewall 212 can substitute the locking structure on the first sidewall 211. That is, the first sidewall 211 can be a mirror image of the second sidewall 212 or have a similar structure to the second sidewall 212.

It is believed that the present embodiments and their advantages will be understood from the foregoing description, and it will be apparent that various changes may be made thereto without departing from the spirit and scope of the invention or sacrificing all of its material advantages, the examples hereto described merely being preferred or exemplary embodiments of the invention.

What is claimed is:

1. A fan holder adapted for attaching a fan to a heat sink comprising:
   a main body comprising two opposite sidewalls;
   a peg mounted on one of the sidewalls and movable in a direction perpendicular to the one of the sidewalls; and
   a handle abutting with an outer side of the one of the sidewalls, comprising an operating portion and a locking portion for engaging with one end of the peg for motivating the peg to move outwardly when the handle is pulled away from the one of the sidewalls, the peg being used to engage downwardly the fan when the fan is mounted on the fan holder thereby securing the fan to the fan holder.

2. The fan holder of claim 1, wherein the one of the two opposite sidewalls has a connecting plate extending horizontally and outwardly from a top thereof, which is provided with a vertical mounting plate at a distal end, the peg being extended through the vertical mounting plate.

3. The fan holder of claim 2, wherein the peg is movable in a direction perpendicular to the mounting plate.

4. The fan holder of claim 3, wherein the peg comprises a head and a shaft extending through the mounting plate and encircled by a spring between the head and the mounting plate.

5. The fan holder of claim 4, wherein the head defines a slope oriented upwards.

6. The fan holder of claim 4, wherein the peg defines an annular recess adjoining an end thereof remote from the head, the locking portion of the handle engaging in the annular recess of the peg.

7. The fan holder of claim 4, wherein the mounting plate defines a through hole for receiving the shaft therein and an arc-shaped flange projecting inwards therefrom and above the connecting plate for incorporating the connecting plate to define a channel in communication with the through hole, and wherein the shaft can only slide in the through hole without rotation.

8. The fan holder of claim 2, wherein the main body defines two spring tabs tilting from two corners thereof approximating to the mounting plate.

9. The fan holder of claim 2, wherein another one of the sidewalls has two spaced locking flakes serving as a locking structure and extending inwards and upwards from a top thereof for engaging downwardly the fan when the fan is mounted on the fan holder thereby securing the fan on the fan holder.

10. A heat dissipation device comprising:
 a heat sink comprising a base and a plurality of fins arranged on the base;
 a fan comprising a frame which has an engaging flange at each corner thereof; and
 a fan holder adapted for attaching the fan to the heat sink comprising a main body having two opposite sidewalls, a peg extending through one of the sidewalls and movable in a direction perpendicular to the one of the sidewalls, and a handle capable of operating the peg, wherein at least one of the engaging flanges of the fan is disposed between the peg and the main body whereby the fan is secured to the fan holder.

11. The heat dissipation device of claim 10, wherein the one of the two opposite sidewalls has a connecting plate extending horizontally and outwardly from a top thereof, which is provided with a vertical mounting plate at a distal end.

12. The heat dissipation device of claim 11, wherein the peg comprises a head resting on the connecting plate and projecting from the one of the sidewalls to lock with the at least one of the engaging flanges, and a shaft extending through the mounting plate and encircled by a spring between the head and the mounting plate.

13. The heat dissipation device of claim 12, wherein the handle abutting with an outer side of the mounting plate and comprising an operating portion and two locking portions, one of the locking portions engaging with an annular recess formed at a distal end of the pegs.

14. The heat dissipation device of claim 12, wherein the mounting plate defines a through hole for receiving the shaft therein and an arc-shaped flange projecting inwards therefrom and above the connecting plate for incorporating the connecting plate to define a channel in communication with the corresponding through holes, and wherein the shaft can only slide in the through hole without rotation.

15. The heat dissipation device of claim 11, wherein the main body defines two spring tabs tilting from two corners thereof approximating to the mounting plate for keeping the engaging flanges of the fan firmly sandwiched between the head of the peg and the main body.

16. The heat dissipation device of claim 11, wherein another one of the sidewalls has two spaced locking plates extending inwards and upwardly from a top thereof for engaging downwardly the fan, thereby cooperating with the peg to secure the fan on the fan holder.

* * * * *